US008655038B2

(12) United States Patent
Keereman et al.

(10) Patent No.: US 8,655,038 B2
(45) Date of Patent: Feb. 18, 2014

(54) METHOD AND ASSEMBLY FOR CORRECTING A RELAXATION MAP FOR MEDICAL IMAGING APPLICATIONS

(75) Inventors: Vincent Keereman, Gent (BE); Stefaan Vandenberghe, Oosterzele (BE); Yves De Deene, Gent (BE)

(73) Assignee: Iminds VZW (BE)

( * ) Notice: Subject to any disclaimer, the term of this patent is extended or adjusted under 35 U.S.C. 154(b) by 105 days.

(21) Appl. No.: 13/202,492

(22) PCT Filed: Feb. 15, 2010

(86) PCT No.: PCT/EP2010/051868
§ 371 (c)(1),
(2), (4) Date: Dec. 12, 2011

(87) PCT Pub. No.: WO2010/094655
PCT Pub. Date: Aug. 26, 2010

(65) Prior Publication Data
US 2012/0076378 A1    Mar. 29, 2012

(30) Foreign Application Priority Data
Feb. 20, 2009   (EP) .................................. 09153351

(51) Int. Cl.
*G06K 9/00* (2006.01)

(52) U.S. Cl.
USPC ........................................................ 382/131

(58) Field of Classification Search
USPC .......................................................... 382/131
See application file for complete search history.

(56) References Cited

U.S. PATENT DOCUMENTS

| 6,603,989 | B1 | 8/2003 | Yablonskiy |
| 6,605,943 | B1 * | 8/2003 | Clark et al. ................... 324/309 |
| 7,567,832 | B2 * | 7/2009 | Schmainda et al. .......... 600/410 |
| 2007/0255129 | A1 | 11/2007 | Du et al. |
| 2008/0258727 | A1 | 10/2008 | Qian et al. |
| 2012/0223710 | A1 * | 9/2012 | Palma et al. .................. 324/309 |

FOREIGN PATENT DOCUMENTS

| EP | 1136836 A2 | 9/2001 |
| WO | 2005026748 A2 | 3/2005 |
| WO | 2008055498 A1 | 5/2005 |

OTHER PUBLICATIONS

International Search Report for PCT/EP2010/051868, Completed by the European Patent Office on Apr. 30, 2010, 5 Pages.
Seevinck et al. "FID Sampling Superior to Spin-Echo Sampling for T*2-Based Quantification of Holmium-Loaded Microspheres: Theory and Experiment", Magnetic Resonance in Medicine 2008, vol. 60, p. 1466-1476.

(Continued)

*Primary Examiner* — Samir Ahmed
*Assistant Examiner* — Totam Le
(74) *Attorney, Agent, or Firm* — Brooks Kushman P.C.

(57) ABSTRACT

A method for correcting a relaxation map of an object scanned with a magnetic resonance imaging modality the object having a plurality of structure and/or tissue types. The method includes deriving a first relaxation map of a scanned object from at least two three-dimensional scans of the object acquired using a sequence of ultrashort echo time pulses adapted for distinguishing between the various types of a plurality of structure and/or tissue types of the object. Information is obtained on the type of structure and/or tissue type present in voxels in the first relaxation map and binarizing the obtained information. A corrected relaxation map is generated by combining the binarized information with the first relaxation map.

10 Claims, 3 Drawing Sheets

(56) References Cited

OTHER PUBLICATIONS

Liu et al. "Ultrashort T*2 Relaxometry for Quantitation of Highly Concentrated Superparamagnetic Iron Oxide (SPIO) Nanoparticle Labeled Cells", Magnetic Resonance in Medicine 2009, vol. 61, p. 761-766.

Harding et al. "NMR microscopy of the uptake, distribution and mobility of dissolution media in small, sub-millimetre drug delivery systems", Journal of Controlled Release 2000, vol. 66, p. 81-99.

Keereman et al. "MR-Based Attenuation Correction for PET using an Ultrashort Echo Time (UTE) sequence", IEEE Nuclear Science Symposium Conference Record 2008, p. 4656-4661.

Keereman et al. "Estimation of attenuation maps from UTE derived R2 images", Intl. Soc. Mag. Reson. Med. 2009, vol. 17, p. 2774, 2 Pages all together.

Zaidi et al. "Advances in Attenuation Correction Techniques in PET", Pet Clinics 2007, vol. 2, No. 2, p. 191-217.

Techawiboonwong et al. "Cortical Bone Water: In Vivo Quantification with Ultrashort Echo-Time MR Imaging", Radiology Sep. 2008, vol. 248, No. 3, p. 824-833.

Robson et al. "Clinical ultrashort echo time imaging of bone and other connective tissues", NMR in Biomedicine 2006, vol. 19, p. 765-780.

Hofmann et al. "MRI-Based Attenuation Correction for PET/MRI: A Novel Approach Combining Pattern Recognition and Atlas Registration", Journal of Nuclear Medicine 2008, vol. 49, p. 1875-1883.

Hofmann et al. "Towards quantitative PET/MRI: A review of MR-based attenuation correction techniques", Eur. J. Nuel Med Mol. Imaging 2009, vol. 36, Supp.1, p. S93-S104.

* cited by examiner

METHOD AND ASSEMBLY FOR CORRECTING A RELAXATION MAP FOR MEDICAL IMAGING APPLICATIONS

CROSS-REFERENCE TO RELATED APPLICATION

This application is the U.S. national phase of PCT Appln. No. PCT/EP2010/051868 filed Feb. 15, 2010, which claims priority to European application 09153351.3 filed Feb. 20, 2009, the disclosures of which are incorporated in their entirety by reference herein.

FIELD OF THE INVENTION

The present invention generally relates to the field of medical imaging. More in particular, it relates to the field of correcting a relaxation map of an object scanned with a medical imaging modality, as used in applications like attenuation or scatter correction.

BACKGROUND OF THE INVENTION

A new generation of medical imaging scanners is currently being developed, which combines the high sensitivity of functional imaging by positron emission tomography (PET) with the wide range of imaging and other applications of magnetic resonance (MR) scanners. This new type of scanners not only enables physicians to acquire anatomical data without any extra radiation dose delivered to the patient, which is already an advantage over PET-Computer Tomography (CT), but also reduces the total time needed for performing both functional and anatomical imaging in the case of a true simultaneous scanner. This increases the throughput of PET and MR departments. A PET-MR scanner is also a very useful research tool, enabling researchers, for example, to validate molecular MR imaging protocols against PET, which can be considered the current gold standard in molecular imaging.

Positron emission tomography provides quantitative images depicting the concentration of the positron emitting substance throughout the patient. The accuracy of this quantitative measurement depends in part on the accuracy of an attenuation and scatter correction which accounts for the absorption or scatter of some of the gamma rays as they pass through the patient.

One of the difficulties in designing a multimodality PET-MR scanner is the derivation of that attenuation map to correct the PET image for said attenuation. The necessity of good attenuation correction has been demonstrated in the literature, definitely for the case of quantitative PET imaging. PET scanners use a transmission source integrated in the PET gantry to acquire an attenuation map. PET-CT scanners acquire a CT image and then rescale Hounsfield units to 511 keV linear attenuation coefficients. The small space available inside the bore of a MR scanner renders both options unfeasible. These methods also deliver a significant radiation dose to the patient, which should always be avoided if possible. A suitable method to derive the attenuation map from the MR image is therefore necessary.

The attenuation map reflects the tissue density distribution across the imaging volume. The high density of some biological tissues, such as cortical bone, is mainly caused by atoms with a high atomic number (compared to hydrogen, carbon, oxygen and other abundant atoms in tissue) such as calcium. This density is the direct source of contrast in a CT image, which makes the use of CT for attenuation correction very straightforward. The implicit difficulty in estimating the attenuation map from MR images is that the MR signal has no direct correlation with tissue density, as MR sequences only measure the relaxation of proton spins in a high magnetic field. The contrast in MR images is thus generated by differences in relaxation properties of tissues rather than by their density. The challenge in MR based attenuation correction is finding a way to determine tissue density based on information that bears no direct correlation with this characteristic.

Some methods have been developed for deriving the attenuation map from a magnetic resonance image. They can be divided into two main classes: registration based or segmentation based. The registration based methods start from a MR template and an attenuation map template. The MR template is registered using non-rigid registration to a patient MR image and the same non-rigid transformation is applied to the attenuation map template. This results in a deformed template attenuation map which theoretically predicts the attenuation map that would be acquired with a PET transmission scan of the patient.

Segmentation based methods derive the attenuation map directly from the MR image intensity. Most methods use a two-step approach: first the image is segmented into tissue classes with a known linear attenuation coefficient (mainly bone, soft tissue and air), after which the voxels belonging to a certain tissue class are assigned the corresponding linear attenuation coefficient. However, the very low signal intensity of cortical bone in images acquired with conventional MR sequences makes it difficult to distinguish this tissue type from air, while cortical bone has an attenuation coefficient strongly different from air. Most segmentation based methods therefore also use some kind of anatomic precondition to segment the images. In general, segmentation based methods yield an attenuation map which does not contain a continuous range of attenuation coefficients, but only a number of discrete values, dependent on the number of tissue types distinguished.

In the paper "MRI-based attenuation correction for PET/MRI: a novel approach combining pattern recognition and atlas registration" (Hofmann et al., *J Nucl Med,* 2008, 49, pp. 1875-1883) a method has recently been proposed which combines pattern recognition and atlas registration to predict the attenuation map. The algorithm is trained by extracting patches out of registered MR and CT data sets and determining a mapping between patches of both modalities. The mapping also uses information from a registered CT which is obtained in the same fashion as in the described registration based methods. The most likely CT-value for every voxel is then derived, yielding a pseudo-CT. The pseudo-CT is then used as input for CT attenuation correction.

A common property of the above-described methods is that the prediction of the attenuation map is somehow based on anatomical reference data. There lies the vulnerability of these methods in clinical practice, since there can be a lot of variability in patient anatomy. One example is the frontal sinus in the skull, the volume of which can range from very small to very large. Other examples are patients with amputated limbs or patients with severe head trauma. A method which does not rely on anatomical reference data would be applicable to all patients without further conditions.

The MR properties of materials like e.g. biological tissue are determined by two relaxation time constants: T1 for longitudinal relaxation and T2 for transverse relaxation of the proton spins. T1 is always larger than T2. Contrast in MRI is generated by the different relaxation properties of tissue types (e.g. normal and pathological tissue). T1 and T2 are large in water. A short T2 relaxation time is found in supporting tissues like tendons, ligaments and cortical bone. Another property that determines the acquired MR signal is the water content or proton density of a tissue. Supporting tissues also contain less water per unit volume.

Ultrashort Time of Echo (UTE) sequences are well known in the art and have also been described in various patent documents. WO2005/026748 relates to systems and techniques for magnetic resonance imaging (MRI) of samples, including components with small T2 values, wherein ultrashort echo times are applied. US2007/255129 also deals with MRI using ultrashort echo times. To a sample, which exhibits long transverse relaxation time (T2) components and short T2 components, a long inversion radio frequency pulse is applied that inverts magnetization of the long T2 components to minimize signals corresponding to the long T2 components. Application US2008/258727 discloses a method for producing a magnetic resonance image using an ultrashort echo time.

Patent document U.S. Pat. No. 6,603,989 deals with T2 contrast in magnetic resonance imaging with gradient echoes. In WO2008/055498 a map of a tissue (or a part thereof or an organ) is determined that displays a certain (clinical or non-clinical) parameter calculated from the originally acquired imaging data. The map can display one or more intrinsic and/or non-intrinsic physical parameters and/or calculated clinical parameters, individually or in combination with other clinical parameters.

In the paper "*MR-based Attenuation Correction for PET using an Ultrashort Echo Sequence (UTE) sequence*" (Keereman et al., IEEE Nuclear Science Symposium Conference Record, October 2008, pp. 4656-4661) a method for estimating an attenuation map is disclosed that can be used even when the considered patient has non-standard anatomic features. The estimated attenuation map can subsequently be used to correct the PET image for attenuation. The paper demonstrates the importance of taking into account bone for attenuation correction. However, an important drawback of the proposed method is that the attenuation map is derived by using thresholds on the image intensity of the long and short echo image acquired with the UTE sequence. As image intensity in MR is not a stable, quantitative measure (it depends on receiver gain settings etc.), this method would be difficult to implement on a large scale as the thresholds would have to be reconfigured for each imaging session. Consequently, there is a need for a method wherein a quantitative parameter is used to derive the attenuation map.

AIMS OF THE INVENTION

The present invention aims to provide a technique for correcting a relaxation map of a scanned object that does not rely on any anatomical reference data and that allows distinguishing between various tissue types or structure types of the scanned object, based on a stable quantitative measure independent of the settings of the medical imaging modality. A further aim is to derive a density image of the scanned object based on the corrected relaxation map.

SUMMARY

The present invention proposes to use the quantitative parameter R2, the transverse relaxation rate in order to achieve the above-mentioned goal. Consequently, the invention relates in a first aspect to method for correcting a relaxation map of an object scanned with a MR imaging modality like, whereby that object comprises a plurality of structure and/or tissue types. The object is typically a (part of a) tissue or an organ. A first estimate of a relaxation map of the scanned object is derived from at least two 3D scans acquired by applying a sequence of pulses adapted for distinguishing between the various structure and/or tissue types. The use of an ultrashort echo time (UTE) pulse sequence indeed allows distinguishing between the various structure and/or tissue types present in the scanned object, like e.g. bone, soft tissue and air. In a next step information is obtained on the content of voxels, i.e. the type of structure and/or tissue type, present in the first estimate of the relaxation map. The obtained information is translated into a binary mask. By combining that binarized information with the first estimate of the relaxation, a corrected estimate of the relaxation map is obtained.

As an ultrashort echo time (UTE) sequence is applied, it is implied a first scan of the at least two scans is preferably acquired at an echo time smaller than 500 µs.

In an advantageous embodiment of the invention the information on the type of structure and/or tissue type contained in the voxels is obtained from the at least two 3D scans. In another embodiment the information on the type of structure and/or tissue type contained in the voxels is obtained from a further 3D image, e.g. a stored PET scan. Alternatively, both options can be combined.

In another embodiment of the invention a filtering (smoothing) operation is performed on at least one of the acquired scans. This allows reducing certain artefacts or noise in the echo images.

In a preferred embodiment the method of the invention further comprises the step of obtaining a density image of the scanned object from the corrected relaxation map. The density images may be obtained by segmenting the corrected relaxation map. They may also be derived by applying a transformation function to convert the corrected relaxation map into an attenuation map. The transformation can be a scaling operation.

In an advantageous embodiment the method of the invention further comprises the step of actually acquiring the at least two scans with magnetic resonance imaging as medical imaging modality.

In another aspect the invention also relates to a program executable on a programmable device containing instructions which, when carried out, perform the method as described above.

In a further aspect the invention relates to a programmable device arranged for executing the program as previously described. In yet a further aspect the invention relates to an assembly of such a programmable device and a medical imaging device arranged for acquiring at least two scans of an object by applying a sequence of UTE pulses adapted for distinguishing between the various types of a plurality of structure and/or tissue types of said object.

DETAILED DESCRIPTION OF THE INVENTION

Figure 1:
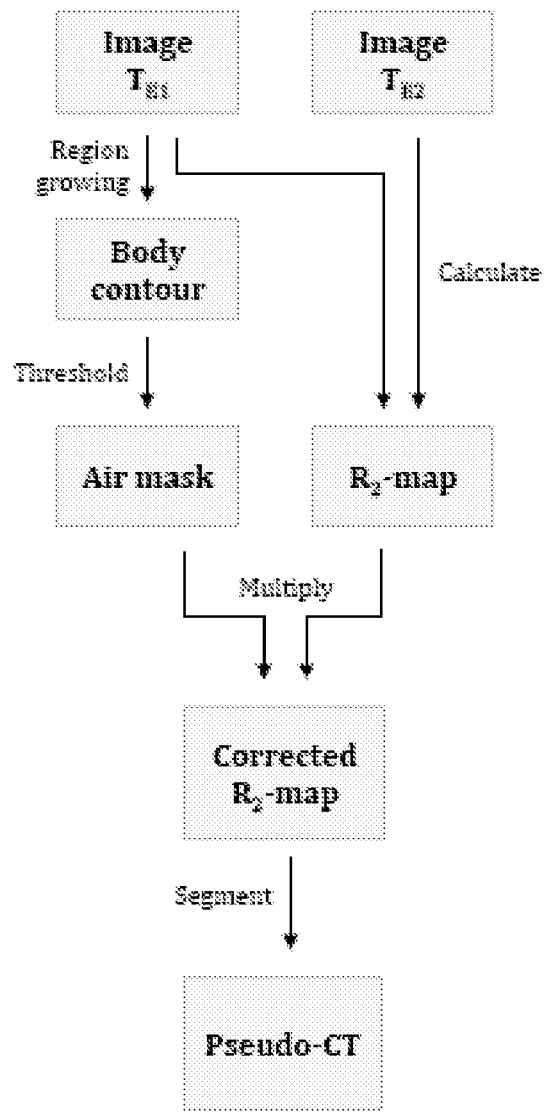
FIG. 1 represents a block scheme of the method according to an embodiment of the present invention.

In order to allow the use of the quantitative transverse relaxation rate parameter to derive a density image, the invention discloses in one aspect a technique for correcting a rough first estimation of a relaxation map derived from at least two three-dimensional images of a medical imaging modality like e.g. MR. Suitable sequences, namely UTE pulse sequences, and image processing techniques are applied to said images to create contrast between various tissue types, e.g. air, soft tissue and cortical bone, based solely on images acquired from the patient. This renders the use of anatomical reference data obsolete.

The low signal intensity of cortical bone in conventional magnetic resonance imaging (MRI), and hence the low contrast between air and cortical bone, is caused by the lower water content of this tissue compared to soft tissue and the very fast transverse relaxation (short T2 relaxation time). Because the relaxation of protons in cortical bone occurs too fast, the MRI signal has disappeared before a conventional MRI sequence starts sampling. Ultrashort echo time (UTE) sequences are extremely suitable to visualize tissues with a short T2, such as tendons or ligaments. Cortical bone even has a much shorter relaxation time than these tissues.

The invention proposes in one aspect to derive from images acquired with an ultrashort echo time (UTE) sequence a corrected map of the transverse relaxation rate parameter R2. This corrected R2 map can subsequently be applied to classify the voxels into a number of tissue classes (e.g. bone, soft tissue or air) without making any assumptions on patient anatomy. The relaxation rate constant R2 is the inverse of the relaxation time T2. It is a tissue-specific parameter that can be used to create tissue contrast and identify tissue properties. The exponential decay that signals acquired with spin echo sequences at a given spin echo time experience, is characterised by the relaxation rate constant R2. R2 maps can be used to obtain data and analyze tissues for certain clinical parameters to generate maps or visual representations of the considered parameter. The R2 parameter is a faithful representation of the magnitude of tissue changes, independent of the pulse sequence or MRI equipment used and is a reliable, reproducible parameter for quantitative calculations. R2 values are said to have been determined by fast spin echo images acquired with varying echo times in the range of 10 to 100 ms.

Each voxel is assigned the relaxation coefficient corresponding to its tissue class. In general the excitation pulse in a UTE pulse sequence has a low flip angle (e.g. 10°), such that the excitation pulse length can be kept much shorter than 100 µs. As the goal of a UTE sequence is to start acquisition as quickly as possible after excitation, the free induction decay (FID) is sampled after excitation rather than first refocusing the proton spins and sampling the resulting gradient or spin echo. For simplicity's sake, the FID is called the first echo in what follows. The first echo time TE1 is defined as the interval between the end of the RF excitation pulse and the start of FID sampling. Depending on the receive coil used, this can result in echo times of 70 to 150 µs. This is much faster than conventional MR sequences which usually have echo times of 1 ms or higher. After sampling over the sampling time Ts a gradient is used to refocus the spins and sample a second echo at TE2. The same acquisition time is used for the second echo.

Once the at least two 3D MR images have been acquired they are processed as illustrated in the block scheme of FIG. 1. Optionally the 3D image is smoothed with an edge-preserving gradient anisotropic diffusion filter to reduce the influence of noise. Then a first R2 map of the image is calculated by voxel-by-voxel computation. It is then multiplied with a binary mask in which all voxels supposed to contain air (derived by thresholding the first image) are set to 0 and other voxels (containing tissue) are set to 1. In this way a correction is performed for voxels containing air. The mask is discussed more in detail below. Only the voxels containing tissue have a value different from 0 in the corrected R2 map. Next, in an optional step, the MR image can be segmented.

As already mentioned, the transverse relaxation rate constant R2 is the inverse of the relaxation time T2. R2 is high in cortical bone and other tissues with a short T2, whereas it is low in tissues with a longer T2, such as most soft tissues. R2 can be estimated from at least two images acquired at different echo times but with all other parameters equal (e.g. receiver gain), like the images acquired with the described UTE sequence. If the signal intensity in a certain voxel at t=0 is $I_0$, the intensity at the two echo times is given by:

$$I_1 = I_0 \exp(-R_2 T_{E1}) \quad \text{(Eq. 1)}$$

$$I_2 = I_0 \exp(-R_2 T_{E2}) \quad \text{(Eq. 2)}$$

whereby $I_1$ and $I_2$ denote the signal intensity at $T_{E1}$ and $T_{E2}$, respectively. The R2-map shows the calculated R2 value of each voxel in the image. This value can easily be derived from the above equations:

$$R2 = (\ln I_1 - \ln I_2)/(T_{E1} - T_{E2}) \quad \text{(Eq. 3)}$$

If more than two images are acquired, different methods for fitting a R2 value to the measured data points can be used. These methods comprise amongst others a least squares fit.

The parameter R2 is very suitable for distinguishing cortical bone and soft tissue, because of the significant difference in relaxation rate between both tissue types. Making a distinction between air and tissue, be it soft tissue or bone, is more difficult because voxels containing air can have a large calculated R2 caused by the artefacts (e.g. ringing) or noise in the first echo image and the better quality of the second echo image. This is improved by smoothing the images before further processing, but true artefacts cannot be corrected in that way. This causes certain voxels containing air to have non-zero intensity in the first echo image (which is an artefact) but a zero or close to zero intensity in the second echo image. In Equation 3 above these properties lead to a very high R2. It is therefore necessary to apply a mask to the data which sets all voxels containing air to 0 in the R2-map. The mask is thus derived from the content of the voxels. This can be done by creating said binary mask from the first echo image. Alternatively, the mask is derived from a further 3D image of the object that is available, like e.g. from a PET scan. It is also possible to combine the two, whereby the information on the content of the voxels is determined via both at least one of the acquired scans and an additional image of the object.

The mask is derived in two steps. First a region-growing approach is used to determine the outer contour of the body (or phantom). For the region growing a number of seeds is used, placed at the outer corners of the image. Starting from these seeds all voxels which have an intensity below a certain value (outer threshold intensity, $I_{th,o}$) are set to 0. Next all voxels which have an intensity below a different threshold (inner threshold intensity, $I_{th,i}$) but are not necessarily connected to the region that was grown in the first step are also set to 0. All remaining voxels are set to 1. The mask is derived in two steps because the high intensity of the border of the scanned object, mainly caused by the fat in skin, allows for a higher threshold than inside the object. When the outer threshold intensity would be used without the region-growing constraint, too many voxels inside the body would be set to 0, which would lead to significant segmentation errors. If the inner threshold would be used, voxels containing air on the outside of the scanned object would not be excluded, which would in turn also lead to segmentation errors.

A voxel-by-voxel multiplication of the binary mask with the rough first R2-map is then used to calculate the corrected R2-map. Because this image now has zero intensity in voxels containing air, medium intensity in voxels containing soft tissue and high intensity in voxels containing cortical bone, it bears resemblance with a CT image.

In a preferred embodiment density images are obtained from the corrected relaxation estimate by converting the pixel values of the corrected R2-map to density values (e.g. 511 keV linear attenuation coefficients LAC) and use them in a reconstruction algorithm. This can be done by either segmenting or transforming (e.g. scaling) the corrected R2 relaxation map.

The segmentation is done by defining the corrected R2 intervals which correspond with a certain tissue type. When considering only air, soft tissue and bone, three intervals are considered and each is assigned a different linear attenuation coefficient (LAC). An example of segmentation intervals could be:

Air: R2=0=>LAC=0/cm
Soft tissue: 0<R2<0.5=>LAC=0.095/cm
Bone: R2>0.5=>LAC=0.12/cm whereby a threshold value of 0.5 $ms^{-1}$ is set as a result of performing some sample measurements.

A transformation, e.g. a scaling approach, can also be used to convert the corrected R2-map into linear attenuation values. This results in an attenuation map with a continuous range of values instead of the discrete values obtained by segmenting. A scaling function projects the corrected R2-values to linear attenuation coefficients. The transformation can be a simple linear function but can also be of more complex form, e.g. a piecewise continuous function. The transformation (scaling) function can be derived from experimental measurements.

Figure 2:
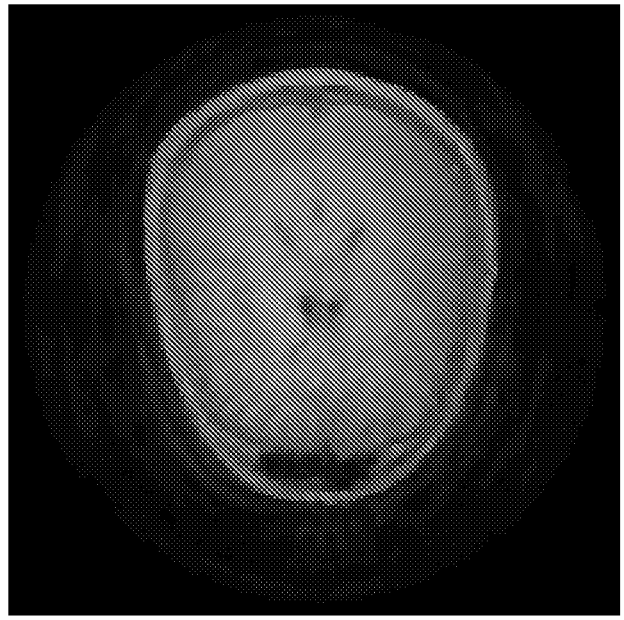
FIG. 2 represents a transverse slice of a human head, acquired with a UTE sequence at a very short echo time (<0.1 ms).
Figure 3:
FIG. 3 represents a transverse slice of a human head, acquired with a UTE sequence at a slightly longer echo time (1.5 ms).
Figure 4:
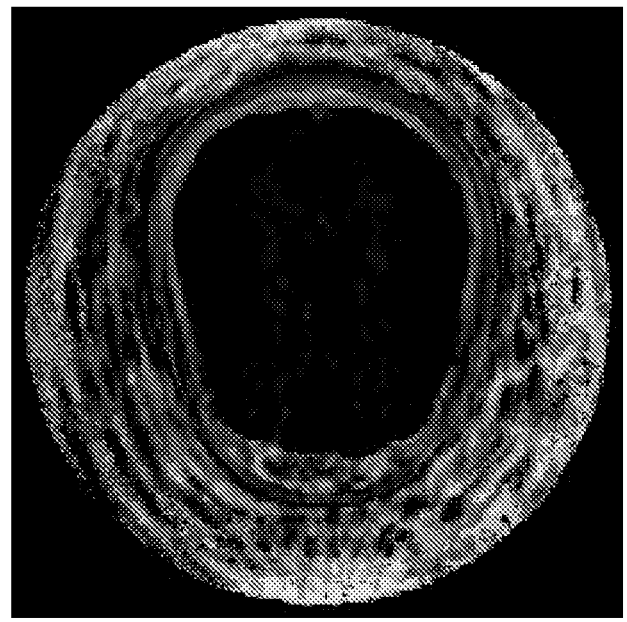
FIG. 4 represents the uncorrected R2-map derived from the images in FIG. 2 and FIG. 3.
Figure 5:
FIG. 5 represents the corrected R2-map derived from the R2-map in FIG. 4 by applying a mask based on the images in FIG. 2 and FIG. 3.

The method of the invention is illustrated in FIGS. 2 to 5. FIG. 2 shows a transverse slice of a human head, acquired with a UTE sequence at a very short echo time (<0.1 ms). Bone (skull) as well as soft tissue (brain) is visible. FIG. 3 is a transverse slice of a human head, acquired with a UTE sequence at a slightly longer echo time (1.5 ms). Bone has a much lower intensity than in FIG. 2, whereas the intensity of soft tissue has remained approximately unchanged. FIG. 4 represents the uncorrected R2-map derived from the images in FIG. 2 and FIG. 3. Bone and air (e.g. outside of the head) both show high R2-values. This image is unusable for segmentation or scaling because air would result in the same attenuation values as bone. Finally, in FIG. 5 the corrected R2-map is shown derived from the R2-map in FIG. 4 by applying a mask based on the images in FIG. 2 and FIG. 3. There is now clear distinction between air (black, 0), soft tissue (dark grey/grey, >0 and <0.5) and bone (light grey/white, >0.5).

The above shows that UTE-derived R2-maps, corrected with an air mask, can indeed be used for MR based attenuation correction. The different image processing steps generate a clear contrast between air, soft tissue and bone. The soft tissue/bone discrimination is excellent by using the R2-map rather than using a subtraction of both echo images which is done in general with UTE images. The distinction between tissue and air relies completely on the first echo image acquired by the UTE sequence.

Because the presented technique truly visualizes cortical bone it is possible to use this method to estimate an attenuation map even when the considered patient has non-standard anatomic features. This is an important advantage over most other methods which do not explicitly visualize cortical bone, but derive its location in an indirect manner, mainly by making some assumption about the patient's general anatomy. While the other methods work fine in patients with an anatomy which can be fitted to the assumed anatomic framework, it is an important realization that clinical examination is done in general on patients with some sort of abnormality. It is therefore important to make as few assumptions as possible about the patient's anatomy when reconstructing medical images.

Possible applications of the proposed method include any application in which a density map derived from MR images is needed. In particular these applications include attenuation and scatter correction for PET or SPECT in the context of multimodality PET/MR or SPECT/MR scanners. Another possible application is the use of MR-derived density images in dose calculation for radiotherapy planning.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A method for correcting a relaxation map of an object scanned with a magnetic resonance imaging modality, said object comprising a plurality of structure or tissue types, said method comprising the steps of:
  deriving a first relaxation map of a scanned object from at least two three-dimensional scans of said object acquired by means of a sequence of ultrashort echo time pulses adapted for distinguishing between the various types of a plurality of structure or tissue types of said object;

obtaining information on the type of structure or tissue type present in voxels in said first relaxation map and binarizing the obtained information;

obtaining a corrected relaxation map by combining said binarized information with said first relaxation map; and deriving a density image of said scanned object from said corrected relaxation map.

2. A method for correcting as in claim 1, wherein said information on the type of structure or tissue type present in said voxels is obtained from said at least two three-dimensional scans.

3. A method for correcting as in claim 1, wherein said information on the type of structure or tissue type in said voxels is obtained from a further three-dimensional scan.

4. A method for correcting as in claim 1, wherein at least one of said acquired scans is filtered for reducing noise.

5. A method for correcting as in claim 1, wherein the density image is derived by performing a segmentation of said corrected relaxation map.

6. A method for correcting as in claim 1, wherein the density image is derived by applying a transformation to convert said corrected relaxation map into said density image.

7. A method as in claim 1, further comprising the initial step of acquiring said at least two three-dimensional scans with said magnetic resonance imaging modality.

8. A non-transitory computer readable medium storing a program, executable on a programmable device containing instructions which, when executed, perform the method as in claim 1.

9. Programmable device arranged for executing a program containing instructions which, when executed, perform the method as in claim 1.

10. Assembly of a programmable device as in claim 9 and a magnetic resonance imaging device arranged for acquiring at least two three-dimensional scans of an object by applying a sequence of ultrashort echo time pulses adapted for distinguishing between the various types of a plurality of structure or tissue types of said object.

* * * * *

UNITED STATES PATENT AND TRADEMARK OFFICE
CERTIFICATE OF CORRECTION

PATENT NO. : 8,655,038 B2  
APPLICATION NO. : 13/202492  
DATED : February 18, 2014  
INVENTOR(S) : Keereman et al.

Page 1 of 1

It is certified that error appears in the above-identified patent and that said Letters Patent is hereby corrected as shown below:

On the title page

Item (73) delete:

"Iminds VZW (BE)"

and insert:

--Universiteit Gent (BE) and Iminds VZW (BE)--

Signed and Sealed this
Twenty-eighth Day of June, 2016

Michelle K. Lee
*Director of the United States Patent and Trademark Office*